United States Patent
Macours

(10) Patent No.: US 9,892,631 B2
(45) Date of Patent: Feb. 13, 2018

(54) AUDIO AND ULTRASOUND SIGNAL PROCESSING CIRCUIT AND AN ULTRASOUND SIGNAL PROCESSING CIRCUIT, AND ASSOCIATED METHODS

(71) Applicant: NXP B.V., Eindhoven (NL)

(72) Inventor: Christophe Marc Macours, Leuven (BE)

(73) Assignee: NXP B.V., Eindhoven (NL)

( * ) Notice: Subject to any disclaimer, the term of this patent is extended or adjusted under 35 U.S.C. 154(b) by 120 days.

(21) Appl. No.: 14/463,425

(22) Filed: Aug. 19, 2014

(65) Prior Publication Data

US 2015/0085620 A1    Mar. 26, 2015

(30) Foreign Application Priority Data

Sep. 20, 2013    (EP) .................................... 13185402

(51) Int. Cl.
    *G08C 23/02*    (2006.01)
    *H03G 3/30*    (2006.01)
    (Continued)

(52) U.S. Cl.
    CPC ........... *G08C 23/02* (2013.01); *H03G 3/3005* (2013.01); *H03G 7/002* (2013.01)

(58) Field of Classification Search
    CPC ....... G08C 23/02; H03G 3/3005; H03G 7/007
    (Continued)

(56) References Cited

U.S. PATENT DOCUMENTS 4,337,527 A    6/1982 Delagrange et al.
4,814,552 A    3/1989 Stefik et al.
    (Continued)

FOREIGN PATENT DOCUMENTS

CN    1640186 A    7/2005
CN    1709588 A    12/2005
    (Continued)

OTHER PUBLICATIONS

Hua, H. et al. "A low-cost dynamic range-finding device based on amplitude-modulated continuous ultrasonic wave", IEEE Trans. on Instrumentation and Measurement, vol. 51, No. 2, 362-367 pgs. (Apr. 2002).

(Continued)

*Primary Examiner* — Quan-Zhen Wang
*Assistant Examiner* — Stephen Burgdorf
(74) *Attorney, Agent, or Firm* — Rajeev Madnawat

(57) ABSTRACT

An audio and ultrasound signal processing circuit (412), comprising:
  an audio input terminal (414) for receiving an input signal comprising an audio input signal;
  an amplitude detector (430), configured to determine an amplitude of the input signal and provide an amplitude level signal (432);
  a gain calculator (434) configured to determine an ultrasound amplification factor (436) in accordance with the amplitude level signal (432) and a target amplitude signal (418);
  a variable ultrasound amplifier (438) configured to receive an ultrasound input signal and modulate an amplitude of the ultrasound input signal in accordance with the ultrasound amplification factor (436) in order to provide an amplified ultrasound signal; and
  an output terminal (416) for providing an enhanced output signal comprising frequency components that correspond to the audio input signal and frequency components that correspond to the amplified ultrasound signal.

19 Claims, 5 Drawing Sheets

(51) Int. Cl.
*H04R 3/00* (2006.01)
*H03G 7/00* (2006.01)

(58) Field of Classification Search
USPC .......................................... 367/137, 138, 199
See application file for complete search history.

(56) References Cited

U.S. PATENT DOCUMENTS

| | | | |
|---|---|---|---|
| 5,043,950 A | 8/1991 | Schorum et al. | |
| 5,758,173 A | 5/1998 | Evoy | |
| 6,047,024 A * | 4/2000 | How | H04L 25/03012 333/18 |
| 7,224,808 B2 | 5/2007 | Spencer et al. | |
| 7,355,322 B2 | 4/2008 | Miyazaki | |
| 7,649,410 B2 | 1/2010 | Anderson et al. | |
| 8,907,929 B2 | 12/2014 | Li et al. | |
| 2007/0170984 A1* | 7/2007 | Andersen | H03F 1/3264 330/10 |
| 2009/0179768 A1* | 7/2009 | Sander | H04M 1/05 340/13.27 |
| 2010/0074056 A1 | 3/2010 | Harada et al. | |
| 2012/0001875 A1 | 1/2012 | Li et al. | |
| 2012/0154037 A1* | 6/2012 | Pfaffinger | H03G 7/007 330/129 |
| 2013/0163784 A1* | 6/2013 | Tracey | H03G 3/00 381/103 |
| 2014/0177874 A1* | 6/2014 | Bogason | H04R 1/005 381/111 |

FOREIGN PATENT DOCUMENTS

| | | | |
|---|---|---|---|
| CN | 101371434 A | 2/2009 | |
| CN | 101557204 A | 10/2009 | |
| CN | 103038725 A | 4/2013 | |
| DE | 10 2012 200 991 A1 | 7/2013 | |
| GB | 1137448 A * | 12/1968 | H03G 3/005 |
| GB | 1 257 520 | 12/1971 | |
| GB | 2 207 757 A | 2/1989 | |
| JP | 5252137 B1 | 4/2013 | |

OTHER PUBLICATIONS

Extended European Search Report for EP Patent Appln. No. 13185402.8 (Jun. 6, 2014).
Extended European Search Report for EP Patent Appln. No. 13185402.8 (Feb. 4, 2014).

* cited by examiner

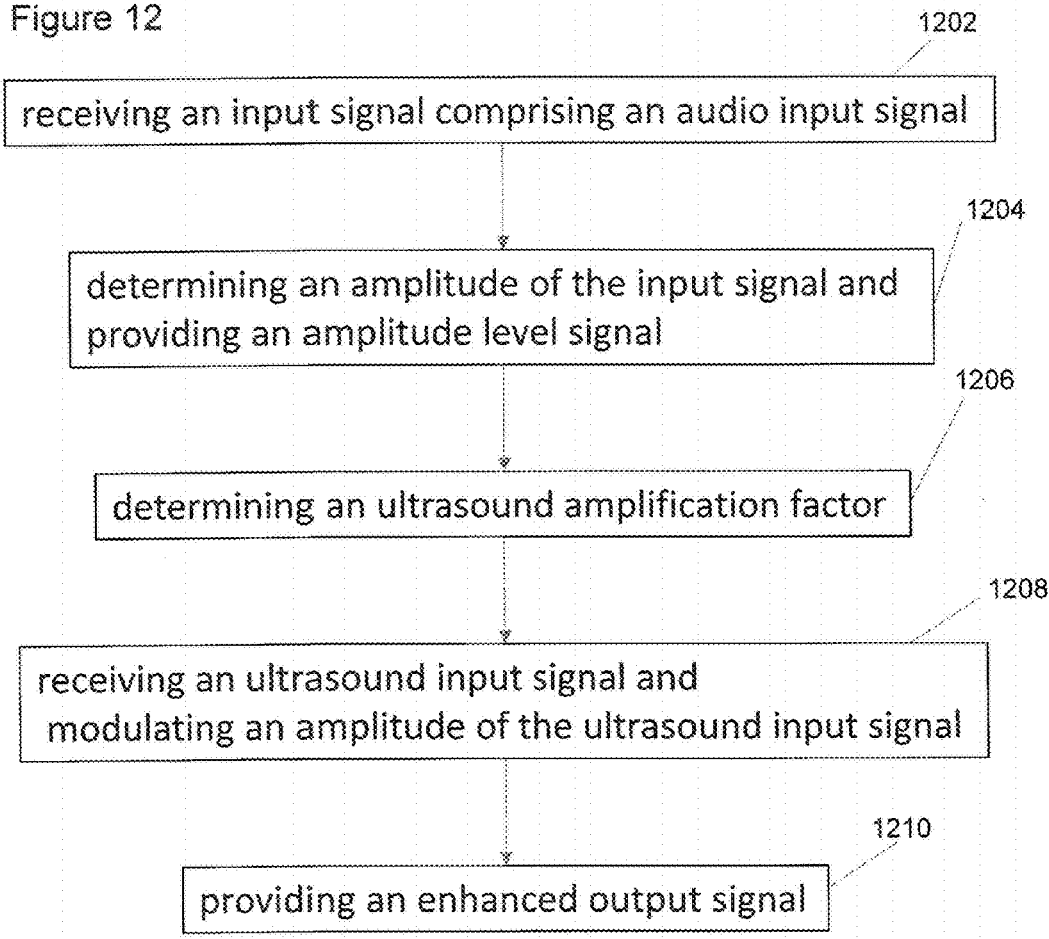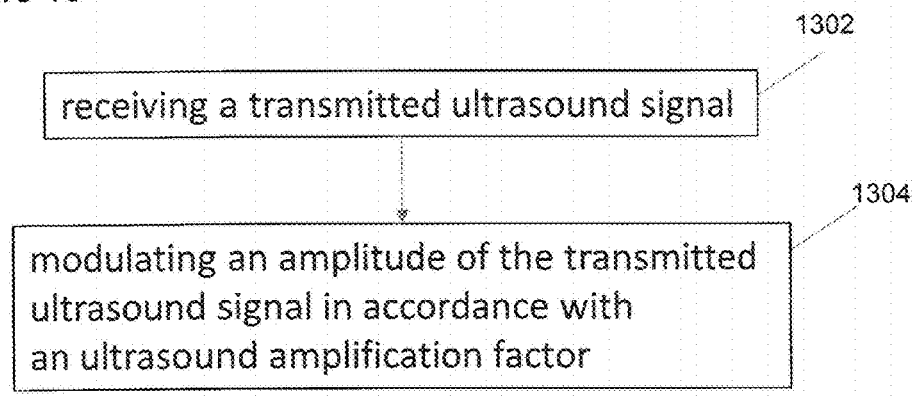

AUDIO AND ULTRASOUND SIGNAL PROCESSING CIRCUIT AND AN ULTRASOUND SIGNAL PROCESSING CIRCUIT, AND ASSOCIATED METHODS

CROSS-REFERENCE TO RELATED APPLICATIONS

This application claims the priority under 35 U.S.C. § 119 of European patent application no. 13185402.8, filed on Sep. 20, 2013, the contents of which are incorporated by reference herein.

The present disclosure relates to audio and ultrasound signal processing circuits and ultrasound signal processing circuits, and associated methods. In particular, but not necessarily, to systems that use ultrasound signal processing for gesture recognition.

Mobile devices and more specifically mobile telephones are getting more and more sophisticated. Touch sensitive displays are now widely used. New gesture recognition technologies are appearing that allow new forms of man-machine interaction. As non-limiting examples, known gesture recognition technologies include EPOS from Qualcomm, SoundWave from Microsoft, Elliptic Labs and Navisense.

According to a first aspect there is provided an audio and ultrasound signal processing circuit, comprising:
   an audio input terminal for receiving an input signal comprising an audio input signal;
   an amplitude detector, configured to determine an amplitude of the input signal and provide an amplitude level signal;
   a gain calculator configured to determine an ultrasound amplification factor in accordance with the amplitude level signal and a target amplitude signal;
   a variable ultrasound amplifier configured to receive an ultrasound input signal and modulate an amplitude of the ultrasound input signal in accordance with the ultrasound amplification factor in order to provide an amplified ultrasound signal; and
   an output terminal for providing an enhanced output signal comprising frequency components that correspond to the audio input signal and frequency components that correspond to the amplified ultrasound signal.

Advantageously, the audio and ultrasound signal processing circuit can enable the amplitude of an ultrasound input signal to be increased when doing so will not be at the expense of the audio input signal, such that the amplified ultrasound signal can be mixed with the audio input signal to provide an enhanced output signal for outputting by a single loudspeaker. The quality of the audio signal may not be significantly reduced, whilst the increased amplitude of the ultrasound input signal can improve an application that uses the ultrasound signalling, such as an associated gesture recognition system.

The amplitude detector may comprise a peak-hold level detector.

The amplitude detector and/or the gain calculator may be configured to update the ultrasound amplification factor at rate that is at least an order of magnitude greater than the frequency of the audio input signal.

The gain calculator may be configured to determine the ultrasound amplification factor in accordance with a difference between the amplitude level signal and the target amplitude signal.

The audio input terminal may also be configured to receive the ultrasound input signal. The variable ultrasound amplifier may be configured to: receive the ultrasound input signal and the audio input signal; modulate the amplitude of the ultrasound input signal in accordance with the ultrasound amplification factor in order to provide an amplified ultrasound signal; and apply a gain factor of about 1 to the audio input signal. An output of the variable ultrasound amplifier may be connected to the output terminal.

The audio and ultrasound signal processing circuit may further comprise: an ultrasound input terminal that is independent of the audio input terminal; and a summer having a first summing input, a second summing input and a summing output. The audio input terminal may be connected to the first summing input. An output of the variable ultrasound amplifier may be connected to the second summing input. The output of the summer may be connected to the output terminal.

The audio and ultrasound signal processing circuit may further comprise an output amplifier configured to amplify the enhanced output signal in order to provide an amplified output signal to a loudspeaker.

The output amplifier may be configured to provide the target amplitude signal.

The audio input signal may comprise components with frequencies in the range of 20 Hz to 20,000 Hz. The ultrasound input signal may comprise components with frequencies greater than 10,000 Hz, 12,000 Hz, 16,000 Hz, or 20,000 Hz, for example.

According to a further aspect, there is provided a method of processing audio and ultrasound signals, the method comprising:
   receiving an input signal comprising an audio input signal;
   determining an amplitude of the input signal and providing an amplitude level signal;
   determining an ultrasound amplification factor in accordance with the amplitude level signal and a target amplitude signal;
   receiving an ultrasound input signal and modulating an amplitude of the ultrasound input signal in accordance with the ultrasound amplification factor in order to provide an amplified ultrasound signal;
   providing an enhanced output signal comprising frequency components that correspond to the audio input signal and frequency components that correspond to the amplified ultrasound signal.

According to a yet further aspect, there is provided an ultrasound signal processing circuit comprising:
   an ultrasound input terminal configured to receive a transmitted ultrasound signal from a microphone; and
   a variable ultrasound attenuator configured to modulate an amplitude of the transmitted ultrasound signal in accordance with an ultrasound amplification factor in order to provide a processed ultrasound signal.

The transmitted ultrasound signal may be representative of information that is to be transferred, or may be representative of a gesture.

The ultrasound signal processing circuit may further comprise an ultrasound decoding block configured to receive and decode the processed ultrasound signal. The ultrasound decoding block may be a gesture recognition block.

According to a further aspect, there is provided a method of processing an ultrasound signal, the method comprising:
   receiving a transmitted ultrasound signal, optionally from a microphone; and modulating an amplitude of the transmitted ultrasound signal in accordance with an ultrasound amplification factor in order to provide a processed ultrasound signal.

There may be provided a gesture recognition system, a spatial location system or an integrated circuit comprising any audio and ultrasound signal processing circuit, ultrasound signal processing circuit, circuit or system disclosed herein.

There may be provided a computer program, which when run on a computer, causes the computer to configure any apparatus, including a processing circuit, audio and ultrasound signal processing circuit, ultrasound signal processing circuit, circuit, controller, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an internet download.

Embodiments of the present invention will now be described by way of example and with reference to the accompanying drawings in which:

FIG. 12 illustrates a process flow that represents a method of processing audio and ultrasound signals; and FIG. 13 illustrates a process flow that represents a method of processing an ultrasound signal.

One or more examples disclosed herein can enable simultaneous playback of regular audio signal without significant degradation in audio performance along with the transmission of ultrasound signals, which may be used for example for gesture recognition. Audio signals may comprise components with frequencies in the range of 20 Hz to 20,000 Hz. Ultrasound signals may comprise components with frequencies greater than 10,000 Hz, 12,000 Hz, 16,000 Hz, 20,000 Hz, 30,000 Hz, 40,000 Hz, 50,000 Hz or more.

Figure 1:
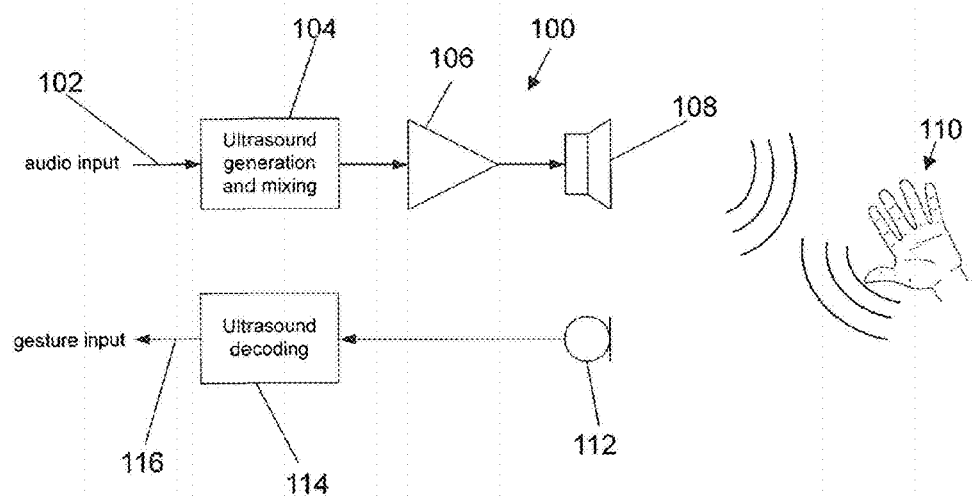
FIG. 1 shows a simplified block diagram of an ultrasound-based gesture recognition system.

FIG. 1 shows a simplified block diagram of an ultrasound-based gesture recognition system 100. The system 100 receives an audio input signal 102, which is provided as an input to an ultrasound generation and mixing block 104, which also receives (or generates itself) an ultrasound input signal (not shown). The ultrasound generation and mixing block 104 provides an output signal, which includes frequency components that correspond to the audio input signal 102 and frequency components that correspond to the ultrasound input signal, to an amplifier 106. The amplifier 106 amplifies the output signal from the ultrasound generation and mixing block 104 and provides the amplified signal to a loudspeaker 108. The loudspeaker 108 outputs a signal at audible frequencies in accordance with the audio input signal and a signal at ultrasound frequencies in accordance with the ultrasound input signal.

As shown schematically with reference 110 in FIG. 1, user gestures generate acoustic path interferences to the ultrasound signal on its way from the loudspeaker 108 to a microphone 112. The loudspeaker 108 and microphone 112 may or may not be part of the same device, for example a mobile telephone.

The microphone 112 provides a signal to an ultrasound decoding block 114 in accordance with the received ultrasound signals. The microphone 112 may be a single microphone or a plurality of microphones. The ultrasound decoding block 114 can then interpret gestures and associated user inputs by determining the acoustic path interferences, which may include for example, (i) processing the time of arrival (TOA) of the ultrasound signals; and/or (ii) performing Doppler or triangulation processing.

The quality and robustness of the ultrasound-based gesture recognition system may rely on the loudspeakers and microphones used. For example, the amplitude of the ultrasound signals should be sufficiently large to obtain a robust detection in the presence of background noise and interferences. This may be required in order to provide an acceptable signal to noise ratio and to enable operation at sufficiently high distances.

One way of achieving a sufficient level of performance is to use piezoelectric transducers (acoustic emitters and receivers) dedicated to ultrasound applications, which can be configured to have highest sensitivity in the ultrasonic frequency range. However, the use of such dedicated transducers may be unacceptable in terms of: (i) the amount of power that they consume; (ii) the extra space that the additional components occupy; and (iii) the financial cost in providing the components. This can be particularly relevant for consumer mobile devices.

One or more embodiments disclosed herein re-use existing loudspeakers and/or microphones, such as those that are present in mobile communications devices, which, by definition, may not be optimized to operate in the ultrasound range.

Figure 2:
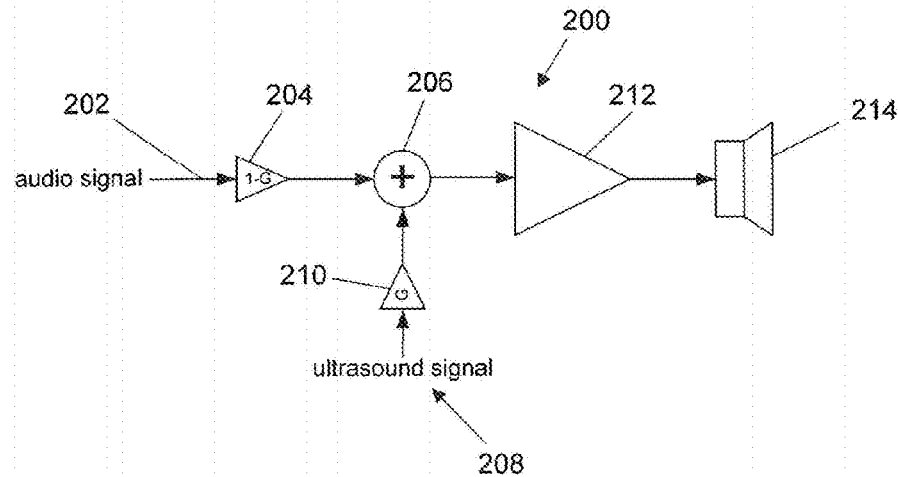
FIG. 2 illustrates a block diagram of a circuit for generating and amplifying a combined audio signal and ultrasound signal.

FIG. 2 illustrates a block diagram of a circuit 200 for generating and amplifying a combined audio signal and ultrasound signal. The system 200 receives an audio input signal 202, which is provided as an input to an audio signal amplifier 204. The audio signal amplifier 204 applies a gain of (1-G) to the audio input signal 202 in order to decrease/attenuate its amplitude. 'G' is described in more detail below. The output of the audio signal amplifier 204 is provided to a first summing input of a summer 206.

The circuit 200 also receives an ultrasound input signal 208, which is provided as an input to an ultrasound signal amplifier 210. The ultrasound signal amplifier 210 applies a gain of G to the ultrasound input signal 208 in order to increase/amplify its amplitude. The output of the ultrasound signal amplifier 210 is provided to a second summing input of the summer 206. The summer 206 therefore combines/mixes the amplified ultrasound signal and the attenuated audio signal such that the signal that is output from the summer has frequency components that correspond to the amplified ultrasound signal and frequency components that correspond to the attenuated audio signal.

The output of the summer 206 is provided as an input to an amplifier 212. The output of the amplifier 212 is provided as an input to a loudspeaker 214. The amplifier 212 performs any amplification that is necessary for the loudspeaker 214 to operate correctly.

In this example, the amplitude of the received audio input signal 202 has already been maximized so as to reliably obtain the highest possible sound pressure level out of the loudspeaker 214. This may mean that the peak amplitude of the audio input signal 202 is very close to the clipping level of the amplifier 212. As is known in the art, the amplifier 212 would provide a distorted output signal if the amplitude of the input signal exceeds a clipping level.

As shown in FIG. 2, the ultrasound input signal 208 is added to the audio input signal 202 before the mixed signal is amplified by the amplifier 212 and fed to the loudspeaker 214. The addition of the ultrasound input signal 208 would result in amplifier clipping if the amplitude of the audio input signal 202 were sufficiently high, which could result in unacceptable audible distortion. This is more likely in examples where the amplitude of the received audio input signal 202 has already been maximized, as mentioned above. One way of reducing the likelihood that clipping occurs, as illustrated in FIG. 2, is for the audio signal amplifier 204 to apply a gain reduction such that the mixed audio and ultrasound signal (the output of the summer 206) is less likely to have an amplitude level that exceeds the clipping level of the amplifier 212. This can be known as providing a signal headroom, and is represented in FIG. 2 by the audio signal amplifier 204 applying a gain of '1-G', where 'G' is the amplitude of the ultrasound signal that is provided to the second input of the summer 206. However, this may result in a suboptimal audio performance due to the reduction in the amplitude of the audio signal.

Figure 3:
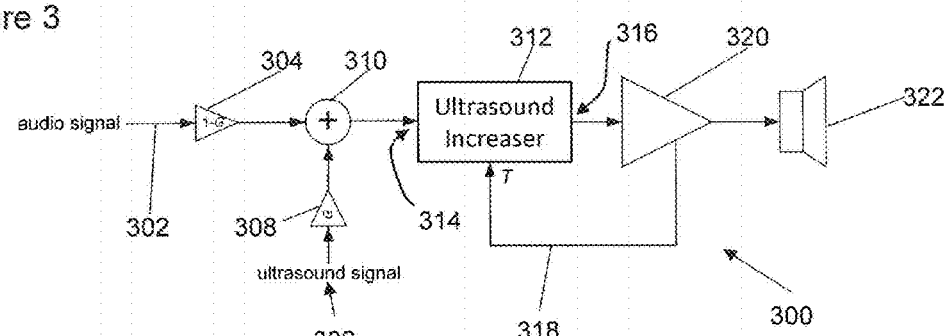
FIG. 3 illustrates a block diagram of a system for mixing an audio input signal and an ultrasound input signal.

FIG. 3 illustrates a block diagram of a system 300 for mixing an audio input signal 302 and an amplified ultrasound input signal 306, and outputting a an enhanced signal from a loudspeaker 322.

The example described with reference to FIGS. 3 to 6 may work on the assumption that the ultrasound signal is already present in the audio signal such that the ultrasound amplification/maximization must be done afterwards. This is typically (but not necessarily) the case when an application processor is connected to a smart output amplifier. The application processor may be the circuitry or device that provides the audio signal and takes care of the ultrasound decoding to generate, for example gesture inputs. In these cases, the application processor can handle the generation and mixing of the ultrasound signal while a smart amplifier can contribute to the ultrasound amplification/maximization by feeding back a target level that takes its own clip level into account. It is known in the art that such a smart amplifier can have embedded processing that allows it to avoid clipping and/or protect a downstream loudspeaker.

In a similar way to that described above with reference to FIG. 2, FIG. 3 includes an audio input signal 302 that is attenuated by an audio signal amplifier 304. The audio signal amplifier 304 applies a gain factor of '1-G'. Similarly, an ultrasound input signal 306 is amplified by an ultrasound signal amplifier 306, which applies a gain factor of 'G'. The attenuated audio input signal and amplified ultrasound signal are mixed/added together by a summer 310.

The output terminal of the summer 310 provides an input signal to an input terminal 314 of an ultrasound increaser block 312. The input terminal 314 in this example is both an audio input terminal and an ultrasound input terminal. The ultrasound increaser block 312 may be referred to as an audio and ultrasound signal processing circuit, and in some examples may be considered as an ultrasound maximization block. The ultrasound increaser block 312 has an output terminal 316 that provides an enhanced output signal to an input of an output amplifier 320. The output of the output amplifier 320 is provided to a loudspeaker 322.

The ultrasound increaser block 312 also receives a target amplitude signal T 318, which represents a target level for the ultrasound signal part of the signal that is received from the summer 310. In this example, the target amplitude signal T 318 is received from the output amplifier 320 in order to provide a feedback loop in real-time. This can be advantageous because the target amplitude signal T 318 can be automatically set in accordance with external factors, such as voltage levels and environmental parameters experienced such that the output amplifier can be used more effectively and efficiently. In other examples however, the target amplitude signal T 318 may be a predetermined value or may be hard-coded.

As will be discussed below with reference to FIG. 4, the output of the ultrasound increaser block 312 is an enhanced output signal comprising (i) frequency components that relate to the audio input signal that is received at the ultrasound increaser block 312; and (ii) frequency components that relate to an amplified ultrasound signal, when such amplification will not exceed a maximum amplitude level. Such a maximum amplitude level may correspond to a clipping threshold of an amplifier or a maximum level that the loudspeaker can handle, as represented by the target amplitude signal T 318. In this way, the ultrasound signal that is transmitted by the loudspeaker 322 has a minimum amplitude value (that corresponds to 'G'), yet has an increased amplitude when there is sufficient headroom in the audio input signal 302.

Figure 4:
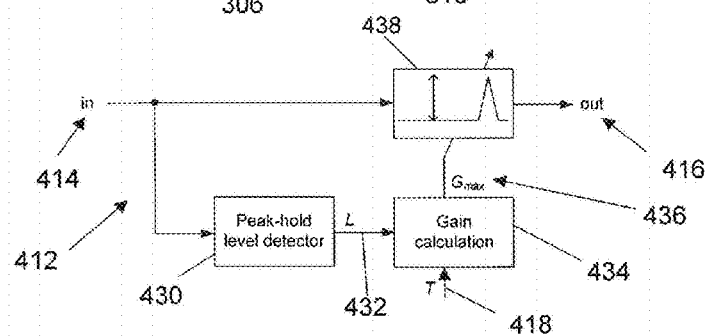
FIG. 4 illustrates further details of the ultrasound increaser block of FIG. 3.

FIG. 4 illustrates further details of the ultrasound increaser block of FIG. 3. The ultrasound increaser block 412 has an audio input terminal 414 for receiving an input signal comprising an audio input signal. In this example the input signal also includes frequency components that correspond to an ultrasound signal. The ultrasound increaser block 412 has an output terminal 416 for providing an enhanced output signal comprising frequency components that correspond to the audio signal and frequency components that correspond to an amplified ultrasound signal.

The input signal received at the audio input terminal 414 is provided as an input to an amplitude detector 430, which in this example is a peak-hold level detector. The peak-hold level detector 430 is configured to determine the amplitude of the input signal and provide as an output an amplitude level signal L 432. As is known in the art, the peak-hold level detector 430 may have one or more time constants that are used to determine the average amplitude level over a specific period of time. In this example the peak-hold level detector 430 can use extremely fast time constants because fast and large gain variations in the ultrasound range are not audible and therefore can be considered acceptable.

The amplitude level signal L 432 and a target amplitude signal T 418 are provided as inputs to a gain calculator 434. In this example, the target amplitude signal T 418 is the maximum amplitude that can be provided at the input to the output amplifier (not shown) without the output suffering from significant distortion. The gain calculator 434 determines an ultrasound amplification factor $G_{max}$ 436 in accordance with the target amplitude signal T 418 and the amplitude level signal L 432.

In this example, the ultrasound amplification factor $G_{max}$ 436 is determined as (with all values expressed in linear amplitude, not in dBFS):

$$G_{max} = 1 + \frac{T-L}{G}$$

where:
T is the target level, as represented by the target amplitude signal T 418;
L is the output of the level detector, as represented by the amplitude level signal L 432; and
G is the ultrasound signal amplitude, which may the same 'G' as shown in FIG. 1.

The ultrasound increaser block 412 also includes a variable ultrasound amplifier 438, which receives the input signal from the audio input terminal 414. As indicated above, the input signal from the audio input terminal 414 comprises frequency components that correspond to both an audio input signal and an ultrasound input signal. The variable ultrasound amplifier 438 modulates an amplitude of the ultrasound input signal in accordance with the ultrasound amplification factor $G_{max}$ 436 in order to provide an amplified ultrasound signal. The ultrasound amplifier is configured such that it only applies a gain to a narrow frequency band of the input signal that is located in the ultrasound range. Therefore, the peak amplitude of the output audio signal is not significantly increased with respect to the audio input by the variable ultrasound amplifier 438. That is, it may apply a gain factor of about 1 to the audio input signal. The variable ultrasound amplifier 438 may be implemented as a high pass filter that amplifies signals at frequencies in the pass-band and applies a gain of 1 to frequencies outside of the pass-band. The variable ultrasound amplifier 438 provides as its output the enhanced output signal comprising frequency components that correspond to the audio input signal and frequency components that correspond to the amplified ultrasound signal. The output of the variable ultrasound amplifier 438 is connected to the output terminal 416 of the ultrasound increaser block 412.

In this way, the amplitude of the ultrasound signal can be increased/boosted when the amplitude of the audio input signal is less than its maximum expected value. Therefore, any headroom in the amplitude of the input signal that is received at the audio input terminal 416 of FIG. 4 can be effectively and efficiently used to provide an enhanced output signal that has a more powerful ultrasound signal without significantly increasing the risk of amplifier clipping or distorting the output of the loudspeaker. This can enable more robust gesture recognition.

Figure 5A:
FIGS. 5a, 5b illustrate graphically in the time domain signals that are associated with the circuit of FIG. 4.
Figure 5B:
Figure 6:
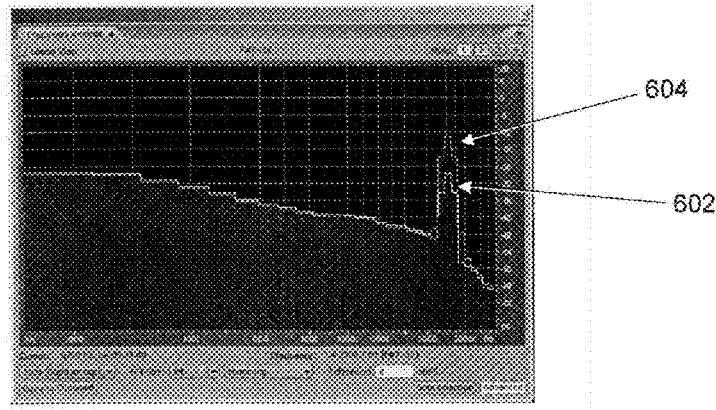
FIG. 6 illustrates graphically in the frequency domain signals that are associated with the circuit of FIG. 4.

FIGS. 5a, 5b and 6 illustrate graphically signals that are associated with the circuit of FIG. 4. These figures illustrate the result for a full scale audio signal normalized to 0 dBFS mixed with a 18 kHz tone at −20 dBFS.

FIG. 5a shows an input signal that is provided as an input signal to the ultrasound amplifier of FIG. 4. FIG. 5b shows an enhanced audio signal and amplified ultrasound signal, as output by the ultrasound amplifier of FIG. 4 in response to receiving the signal of FIG. 5a. The audio signal components of FIG. 5b correspond to the audio input signal of FIG. 5a. The horizontal axes in FIGS. 5a and 5b represent time.

FIG. 5a shows as reference 502 a period of time at which the amplitude of the input signal is less than its maximum value. FIG. 5b identifies the corresponding period of time with reference 504. In this period of time 502, 504 it can be seen that the amplitude of the enhanced signal in FIG. 5b is higher than the input signal. When the input signal becomes high again after the period of time with reference 502, the enhanced signal of FIG. 5b has the same peak amplitude as the input signal. As shown in FIG. 6, the increase in amplitude is due to an amplification of signals at ultrasound frequencies (the ultrasound signals).

FIG. 6 illustrates the frequency spectra of two signals 602, 604 that are associated with the circuit of FIG. 4. The horizontal axis represents frequency and the vertical axis represents power.

A first signal 602 represents the input signal that is provided to the ultrasound increaser block. A second signal 604 represents the enhanced audio signal and amplified ultrasound signal. It can be seen that the power level of the first signal 602 is the same or substantially the same as the power level of the second signal 604 for frequencies at audible frequencies (on the left-hand side of FIG. 6). However, the power level of the second signal 604 is higher than the power level of the first signal 602 for frequencies at ultrasound frequencies (on the right-hand side of FIG. 6) due to the amplified signals at these frequencies.

Figure 7:
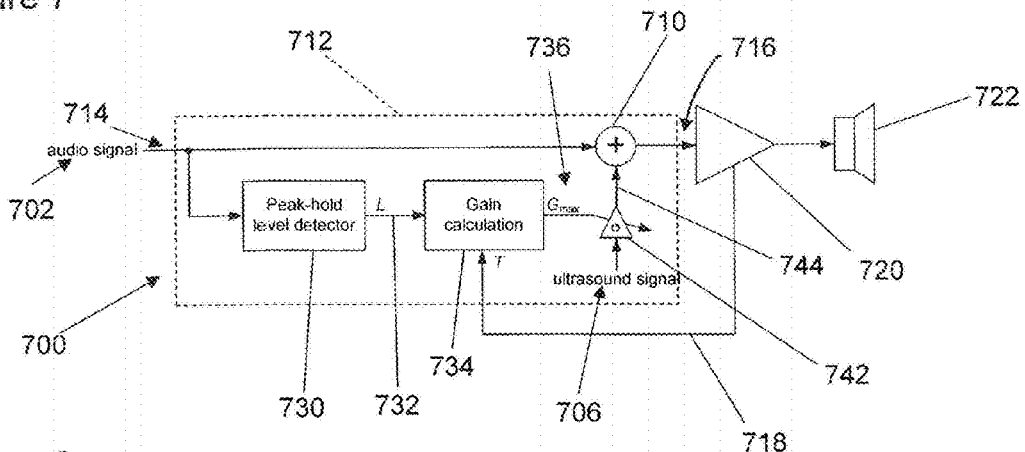
FIG. 7 illustrates a block diagram of another system for mixing an audio signal and an ultrasound signal.

FIG. 7 illustrates a block diagram of another system 700 for mixing an audio signal 702 and an ultrasound signal 706, and outputting an enhanced signal from a loudspeaker 722.

The example described with reference to FIGS. 7 to 9 can cover the case where the ultrasound signal generation, maximization and mixing are combined. In this case, all operations can be performed in a smart amplifier at a higher sampling rate than would be possible with the application processor, which may be referred to as a host sampling rate. This can allow the generation, maximization and mixing of higher ultrasound frequencies (for example 50 kHz) than would be the case with the example described with reference to FIGS. 3 to 6.

An audio and ultrasound signal processing circuit of the system 700 is identified with reference 712. The output terminal 716 of the audio and ultrasound signal processing circuit 712 is connected to an input of an output amplifier 720. The output of the output amplifier 720 is connected to an input of the loudspeaker 722.

The audio and ultrasound signal processing circuit 712 has an audio input terminal 714 for receiving an input signal comprising an audio input signal 702. In this example the input signal that is provided to the audio input terminal 714 does not include the ultrasound input signal 706; instead the audio and ultrasound signal processing circuit 712 has a separate ultrasound input terminal that is independent of the audio input terminal 714. The ultrasound input signal may be generated internally within the audio and ultrasound signal processing circuit 712. The audio and ultrasound signal processing circuit 712 has an output terminal 716 for providing an enhanced output signal comprising frequency components that correspond to the audio input signal and frequency components that correspond to an amplified ultrasound signal 744.

An amplitude detector 730 receives the audio input signal 702 and determines an amplitude of the audio input signal in order to provide an amplitude level signal L 732. In the same way as discussed above with reference to FIG. 4, the amplitude detector may be a peak-hold level detector 730.

The amplitude level signal L 732 and a target amplitude signal T 718 are provided as inputs to a gain calculator 734. As with the example of FIG. 3, the target amplitude signal T 718 is the maximum amplitude that can be provided at the input to the output amplifier 720 without imparting significant distortion. The gain calculator 734 determines an ultrasound amplification factor $G_{max}$ 736 in accordance with the target amplitude signal T 718 and the amplitude level signal L 732.

The ultrasound amplification factor $G_{max}$ 736 is provided as a control input to a variable ultrasound amplifier 742; the gain of the variable ultrasound amplifier 742 is set in accordance with the ultrasound amplification factor $G_{max}$ 736. The ultrasound input signal 706 is provided as an input to the variable ultrasound amplifier 742. The output of the variable ultrasound amplifier 742 is the ultrasound input signal multiplied by a gain factor that is set in accordance with the ultrasound amplification factor $G_{max}$ 736. In this way, the ultrasound amplifier 742 modulates an amplitude of the ultrasound input signal 706 in accordance with the ultrasound amplification factor 736 in order to provide an amplified ultrasound signal 744.

In this example, the gain 'G' of the variable ultrasound amplifier 742 is set as $G_{max}$, which can be calculated using the following equation:

$$G_{max} = T - L$$

The audio and ultrasound signal processing circuit 712 also includes a summer 710 that receives the audio input signal 702 at a first summing input and receives the amplified ultrasound signal 744 at a second summing input. The summing output of the summer 710 is connected to the output terminal 716 of the audio and ultrasound signal processing circuit 712, which provides the enhanced output signal comprising frequency components that correspond to the audio input signal 702 and frequency components that correspond to the amplified ultrasound signal 744.

The system 700 of FIG. 7 enables any periods of time at which the amplitude of the audio input signal 702 is less than its expected maximum value to be used to also transmit ultrasound signals from the loudspeaker 722. The peak-hold level detector 730 and/or the gain calculator 734 may be configured to update the ultrasound amplification factor $G_{max}$ 736 at a desired rate. This may involve setting one or more time constants accordingly. Depending upon how the time constants of the peak-hold level detector 730 are set, the ultrasound amplification factor $G_{max}$ 736 can be updated at a rate such that ultrasound signals are mixed with the audio input signal 702 when the peak amplitude of the audio input signal 702 is less than a maximum value. Alternatively or additionally, as discussed below with reference to FIGS. 8 and 9, the ultrasound amplification factor $G_{max}$ 736 can be dynamically set sufficiently quickly such that ultrasound signals are mixed with the audio input signal 702 in between peaks of the audio input signal 702. This can be applied irrespective of whether or not the peak value of the audio input signal 802 is at its maximum expected value.

Figure 8:
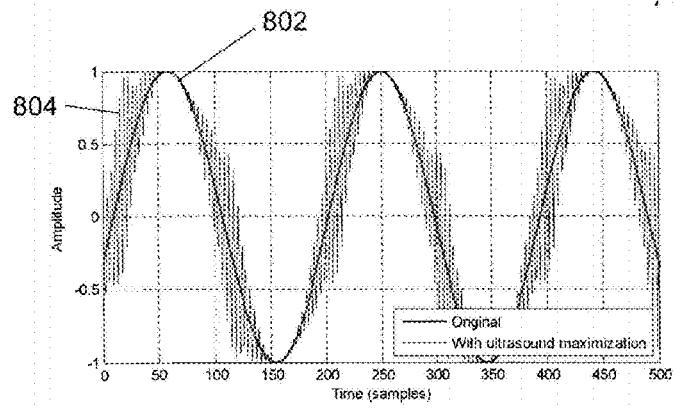
FIG. 8 illustrates graphically in the time domain signals that are associated with the circuit of FIG. 7.
Figure 9:
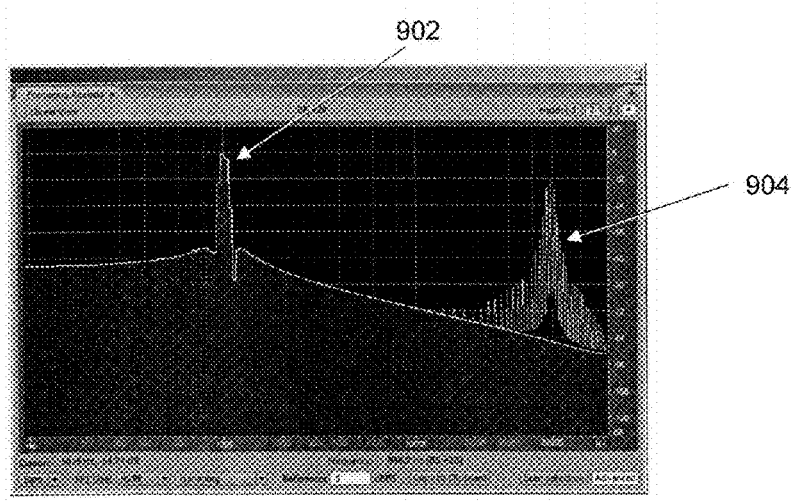
FIG. 9 illustrates graphically in the frequency domain signals that are associated with the circuit of FIG. 7.

FIGS. 8 and 9 illustrate graphically signals that are associated with the circuit of FIG. 7. These figures illustrate results for a 50 kHz tone as the ultrasound input signal and a full-scale 1 kHz tone as the audio input signal.

FIG. 8 shows the 1 kHz audio input signal 802 as a sine wave at its maximum expected amplitude. The horizontal axis in FIG. 8 represents time. The enhanced output signal 804 (which comprises the audio input signal 802 and the amplified ultrasound signal) is also shown in FIG. 8. It can be seen that the amplified ultrasound signal is mixed with the audio input signal in between the peaks in the sine wave-shaped audio input signal. In other words, the amplitude of the ultrasound signal is reduced as the instantaneous value of the audio signal increases. In order to achieve this functionality, the ultrasound amplification factor may be updated at a rate that is at least an order of magnitude greater than the frequency of the audio input signal. For example, it may be 10 times greater, 20 times greater, or 50 times greater.

FIG. 9 illustrates the frequency spectra of two signals 902, 904 that are associated with the circuit of FIG. 7. The horizontal axis represents frequency and the vertical axis represents power.

A first signal 902 represents the audio input signal. A second signal 904 represents the enhanced output signal comprising the audio signal and the amplified ultrasound signal. It can be seen that the power level of the first signal 902 is the same or substantially the same as the power level of the second signal 904 for frequencies at audible frequencies (on the left-hand side of FIG. 9). However, the power level of the second signal 904 is higher than the power level of the first signal 902 for frequencies at ultrasound frequencies (on the right-hand side of FIG. 9), due to the ultrasound signalling that has been added.

FIGS. 8 and 9 illustrate that even if the audio input signal amplitude is at full-scale, it is still possible for the loudspeaker to be used to transmit a significant amount of ultrasound signalling.

Figure 10:
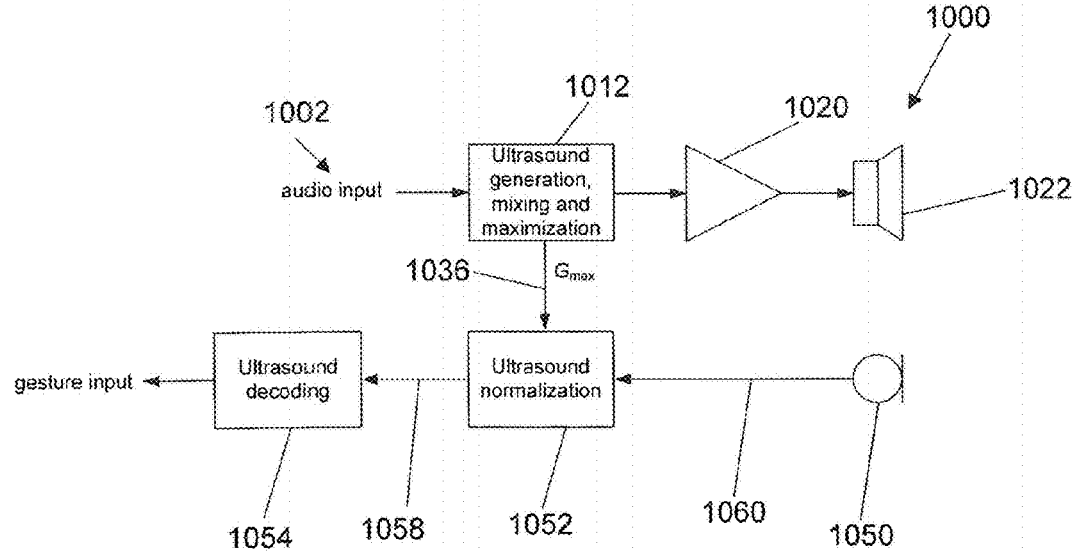
FIG. 10 shows a simplified block diagram of an ultrasound-based gesture recognition system.

FIG. 10 shows a simplified block diagram of an ultrasound-based gesture recognition system 1000 that can communicate information using ultrasound signals between an emitter (loudspeaker 1022) and a sensor (microphone 1050).

The system 1000 receives an audio input signal 1002, which is provided as an input to an ultrasound generation, mixing and maximisation block 1012 such as the blocks described above with reference to FIGS. 3 to 9. The ultrasound generation, mixing and maximisation block 1012 also receives, or generates itself, an ultrasound input signal (not shown). The ultrasound generation, mixing and maximisation block 1012 provides an enhanced output signal, which is a combination of the audio input signal 1002 and an amplified ultrasound signal, to an output amplifier 1020. When providing the enhanced output signal, the ultrasound generation, mixing and maximisation block 1012 also generates an ultrasound amplification factor $G_{max}$ 1036, which represents the amplitude of the ultrasound components in the enhanced output signal in the same way as discussed above.

The output amplifier 1020 amplifies the enhanced signal and provides the amplified signal to a loudspeaker 1022. The loudspeaker 1022 outputs a signal that includes audible components and ultrasound components.

The signal that is output by the loudspeaker 1022 can be received by one or more microphones 1050. As shown in FIG. 1, a gesture can be performed in the signal path between the loudspeaker 1022 and the microphone 1050 that interferes with the transmitted signal.

The microphone 1050 provides an output signal 1060, which includes frequency components that correspond to the transmitted ultrasound signal, to an ultrasound input terminal of an ultrasound normalization block 1052. In this example, the transmitted ultrasound signal is representative of a gesture. The ultrasound normalization block 1052 is an example of an ultrasound signal processing circuit. The ultrasound normalization block 1052 also receives the ultrasound amplification factor $G_{max}$ 1036 from the ultrasound generation, mixing and maximisation block 1012. The ultrasound normalization block 1052 can then normalize the received ultrasound signal in accordance with the value of the ultrasound amplification factor $G_{max}$ 1036 that was used to amplify the ultrasound input signal before it was transmitted. The ultrasound normalization block 1052 outputs a signal 1058, which includes frequency components that correspond to a processed ultrasound signal, to a gesture recognition block 1054. The gesture recognition block 1054 can decode the processed ultrasound signal in order to determine a gesture that was performed in the signal path between the loudspeaker 1022 and the microphone 1050.

Figure 11:
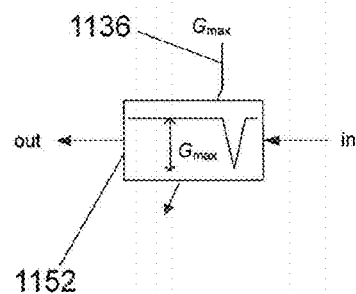
FIG. 11 shows an example implementation of the ultrasound normalization block of FIG. 10.

FIG. 11 shows an example implementation of the ultrasound normalization block of FIG. 10. The ultrasound normalization block 1152 comprises a variable ultrasound attenuator that modulates an amplitude of the transmitted ultrasound signal in accordance with the ultrasound amplification factor $G_{max}$ 1136 that was used to amplify the ultrasound input signal in order to provide a processed ultrasound signal. In this example, the processed ultrasound signal is for use in gesture recognition.

The ultrasound normalization block 1152 of this example applies a gain value that is inverse to $G_{max}$ (1/Gmax) to a narrow frequency band located in the ultrasound range in order to attenuate the associated signals. The ultrasound normalization block 1152 may apply a gain of 1 to frequencies outside of the narrow frequency band, including frequencies that correspond to audio signals. In this way, it is possible to determine the amplitude of the ultrasound input signal that was mixed with the audio input signal by the ultrasound generation, mixing and maximisation block, without affecting any frequency components that correspond to audio signals. Therefore, the effect of the ultrasound level variations introduced before transmission by the loudspeaker can be reduced or removed, which can result in an improved signal to noise ratio in the ultrasound range. Also, it can be possible to use amplitude modulation techniques as part of the gesture recognition processing, even though the amplitude of the ultrasound signal can be dynamically adjusted before transmission.

The complete loop of FIG. 11 can be considered as a pre-emphasis (ultrasound maximization)/de-emphasis (ultrasound normalization) system that can improve or maximize the signal-to-noise ratio in the ultrasound range.

It will be appreciated that the enhanced output signal described in this document can be used for applications other than gesture recognition. Such applications include location-based advertising, (secure) data transfer through ultrasound, and presence detection, as non-limiting examples.

FIG. 12 illustrates a process flow that represents a method of processing audio and ultrasound signals. The method begins at step 1202 by receiving an input signal comprising an audio input signal, the input signal may optionally also include an ultrasound signal. The method continues at step 1204 by determining an amplitude of the input signal and providing an amplitude level signal.

At step 1206, the method comprises determining an ultrasound amplification factor in accordance with the amplitude level signal and a target amplitude signal. This may involve subtracting the amplitude level signal from the target amplitude signal. The method continues at step 1208 by receiving an ultrasound input signal and modulating an amplitude of the ultrasound input signal in accordance with the ultrasound amplification factor in order to provide an amplified ultrasound signal. At step 1210, the method comprises providing an enhanced output signal comprising frequency components that correspond to the audio input signal and frequency components that correspond to the amplified ultrasound signal.

FIG. 13 illustrates a process flow that represents a method of processing an ultrasound signal. The method comprises, at step 1302, receiving a transmitted ultrasound signal, optionally from a microphone. The transmitted ultrasound signal may be representative of a gesture. At step 1304, the method comprises modulating an amplitude of the transmitted ultrasound signal in accordance with an ultrasound amplification factor, which may be in order to provide a processed ultrasound signal for gesture recognition.

It will be appreciated that any of the audio signals disclosed herein include signals that are representative of audio signals; that is they may be information signals that once output by a loudspeaker are at a frequency that is generally audible to the human ear. Similarly, any of the ultrasound signals disclosed herein include signals that are representative of ultrasound signals; that is they may be information signals that once output by a loudspeaker are at a frequency that is generally not audible to the human ear.

One or more of the examples disclosed herein can increase or maximize an ultrasound signal amplitude based on an instantaneous audio signal level in such a way that the peak audio signal amplitude remains unchanged.

At least some of the circuits and systems disclosed in this document can be provided in any user-controlled electronic device that is equipped with either or both of a loudspeaker and a microphone. For example, the electronic device may be a mobile computing device or a mobile communication device such as a mobile telephone, tablet, notebook, laptop, etc.

It will be appreciated that any components that are described herein as being coupled or connected could be directly or indirectly coupled or connected. That is, one or more components could be located between two components that are said to be coupled or connected whilst still enabling the required functionality to be achieved.

The invention claimed is:

1. An audio and ultrasound signal processing circuit, comprising:
    an input terminal for receiving an input signal that includes an audio input signal and an ultrasound input signal related to an acoustic path interference corresponding to a gesture or spatial location;
    an amplitude detector, configured to determine an amplitude of the input signal and provide an amplitude level signal representing the determined amplitude;
    a gain calculator configured to determine an ultrasound amplification factor in accordance with the amplitude level signal and a target amplitude signal;
    a variable ultrasound amplifier configured to respond to the input signal from the input terminal and modulate an amplitude of the ultrasound input signal in accordance with the ultrasound amplification factor in order to provide an amplified ultrasound signal and to maintain an amplitude of the audio input signal; and
    an output terminal configured to provide an enhanced output signal that includes frequency components that correspond to the audio input signal and frequency components that correspond to the amplified ultrasound signal.

2. The audio and ultrasound signal processing circuit of claim 1, wherein the amplitude detector and/or the gain calculator are configured to update the ultrasound amplification factor at a rate that is at least an order of magnitude greater than the frequency of the audio input signal.

3. The audio and ultrasound signal processing circuit of claim 1, wherein the gain calculator is configured to determine the ultrasound amplification factor in accordance with a difference between the amplitude level signal and the target amplitude signal.

4. The audio and ultrasound signal processing circuit of claim 1, wherein:
the input terminal is also configured to receive the ultrasound input signal,
the variable ultrasound amplifier is configured to:
modulate the amplitude of the ultrasound input signal in accordance with the ultrasound amplification factor in order to provide an amplified ultrasound signal; and
apply a gain factor to the audio input signal; and
an output of the variable ultrasound amplifier is connected to the output terminal.

5. The audio and ultrasound signal processing circuit of claim 1, further comprising an output amplifier configured to amplify the enhanced output signal in order to provide an amplified output signal to a loudspeaker.

6. The audio and ultrasound signal processing circuit of claim 5, wherein the output amplifier is configured to provide the target amplitude signal.

7. The audio and ultrasound signal processing circuit of claim 1, wherein the audio input signal comprises components with frequencies in a range of 20 Hz to 20,000 Hz, and the ultrasound input signal comprises components with frequencies greater than 20,000 Hz.

8. The audio and ultrasound signal processing circuit of claim 1, further comprising an ultrasound decoding block configured to receive and decode a returned amplified ultrasound input signal.

9. A gesture recognition system or a spatial location system comprising the audio and ultrasound signal processing circuit of claim 1, wherein the input or output terminal is part of the system.

10. The audio and ultrasound signal processing circuit of claim 9, wherein the audio and ultrasound signal processing circuit is configured to output the ultrasound amplification factor to a portion of the gesture recognition system or a portion of the spatial location system.

11. An integrated circuit comprising the audio and ultrasound signal processing circuit of claim 1, wherein the input or output terminal is part of the integrated circuit.

12. The audio and ultrasound signal processing circuit of claim 1, further comprising a summer that is configured to:
generate the input signal by combining the audio input signal and the ultrasound input signal; and
provide the input signal to the variable ultrasound amplifier.

13. The audio and ultrasound signal processing circuit of claim 12, wherein the variable ultrasound amplifier is further configured to amplify the ultrasound input signal portion of the input signal using a high-pass filter.

14. The audio and ultrasound signal processing circuit of claim 1, wherein the ultrasound input signal is configured and arranged to facilitate gesture recognition.

15. The audio and ultrasound signal processing circuit of claim 1, wherein the ultrasound input signal is configured and arranged to facilitate spatial recognition.

16. The audio and ultrasound signal processing circuit of claim 1, further comprising:
the output terminal configured to provide the enhanced output signal to an output amplifier; and
the output amplifier configured to provide an amplified output signal to a loudspeaker using the enhanced output signal.

17. The audio and ultrasound signal processing circuit of claim 1, wherein the output terminal is configured to provide the enhanced output signal as feedback to the audio and ultrasound signal processing circuit.

18. A method of processing audio and ultrasound signals in a gesture or spatial recognition system, the method comprising:
receiving an input signal comprising an audio input signal and an ultrasound input signal corresponding to an acoustic path interference, wherein the ultrasound input signal is related to a gesture or spatial location;
determining an amplitude of the input signal and providing an amplitude level signal representing the determined amplitude of the input signal;
determining an ultrasound amplification factor in accordance with the amplitude level signal and a target amplitude signal;
modulating an amplitude of frequency components of the ultrasound input signal in accordance with the ultrasound amplification factor in order to provide an amplified ultrasound signal and maintaining the amplitude of the audio input signal; and
providing an enhanced output signal comprising frequency components that correspond to the audio input signal and the frequency components that correspond to the amplified ultrasound signal.

19. The method of claim 18, wherein the amplitude of frequency components of the ultrasound input signal are modulated while maintaining an amplitude for frequency components of the audio input signal.

* * * * *